United States Patent
Lee et al.

(10) Patent No.: US 7,183,195 B2
(45) Date of Patent: Feb. 27, 2007

(54) METHOD OF FABRICATING DUAL DAMASCENE INTERCONNECTIONS OF MICROELECTRONIC DEVICE USING HYBRID LOW K-DIELECTRIC AND CARBON-FREE INORGANIC FILLER

(75) Inventors: Kyoung-woo Lee, Seoul (KR); Soo-geun Lee, Suwon (KR); Wan-jae Park, Suwon (KR); Jae-hak Kim, Seoul (KR); Hong-jae Shin, Seoul (KR)

(73) Assignee: Samsung Electronics, Co., Ltd. (KR)

( * ) Notice: Subject to any disclaimer, the term of this patent is extended or adjusted under 35 U.S.C. 154(b) by 234 days.

(21) Appl. No.: 10/625,007

(22) Filed: Jul. 23, 2003

(65) Prior Publication Data

US 2004/0132291 A1    Jul. 8, 2004

Related U.S. Application Data

(63) Continuation-in-part of application No. 10/081,661, filed on Feb. 22, 2002, now Pat. No. 6,828,229, and a continuation-in-part of application No. 10/437,529, filed on May 14, 2003, now Pat. No. 6,855,629, and a continuation-in-part of application No. 10/114,274, filed on Apr. 2, 2002, now Pat. No. 6,861,347.

(30) Foreign Application Priority Data

Jul. 24, 2002   (KR) .................. 10-2002-0043477
Jul. 3, 2003    (KR) .................. 10-2003-0044852

(51) Int. Cl.
*H01L 21/4763*  (2006.01)

(52) U.S. Cl. .................. 438/622; 438/618; 438/620; 438/624; 438/634; 438/637; 438/638; 438/639; 438/640; 257/E21.579

(58) Field of Classification Search ........ 438/637–640, 438/706, 783, 634, 756, 798
See application file for complete search history.

(56) References Cited

U.S. PATENT DOCUMENTS 4,201,579 A * 5/1980 Robinson et al. ........... 430/323
5,364,813 A   11/1994 Koh ............................ 437/52

(Continued)

FOREIGN PATENT DOCUMENTS

JP        2000-340649        12/2000

(Continued)

OTHER PUBLICATIONS

Jiang, P, et al., Trench Etch Processes for Dual Damascene Patterning of Low-*k* Dielectrics, J. Vac. Sci. Technol. A 19(4), Jul./Aug. 2001, pp. 1388-1391.
S. Wolf and R.N. Tauber, Silicon Processing, Lattice Press, vol. 1, p. 171.

*Primary Examiner*—Michael Lebentritt
*Assistant Examiner*—Kyoung Lee
(74) *Attorney, Agent, or Firm*—Mills & Onello LLP

(57) ABSTRACT

A method of fabricating dual damascene interconnections is provided. A dual damascene region is formed in a hybrid dielectric layer having a dielectric constant of 3.3 or less, and a carbon-free inorganic material is used as a via filler. The present invention improves electrical properties of dual damascene interconnections and minimizes defects.

51 Claims, 16 Drawing Sheets

U.S. PATENT DOCUMENTS

| | | | |
|---|---|---|---|
| 5,989,997 A | 11/1999 | Lin et al. | 438/622 |
| 6,030,901 A | 2/2000 | Hopper et al. | 438/711 |
| 6,057,239 A | 5/2000 | Wang et al. | 438/689 |
| 6,093,966 A | 7/2000 | Venkatraman et al. | 257/751 |
| 6,127,089 A | 10/2000 | Subramanian et al. | 430/270 |
| 6,168,726 B1 | 1/2001 | Li et al. | 216/79 |
| 6,171,951 B1 * | 1/2001 | Lee et al. | 438/640 |
| 6,211,068 B1 | 4/2001 | Huang | 438/634 |
| 6,221,759 B1 | 4/2001 | Bothra et al. | 438/627 |
| 6,319,815 B1 | 11/2001 | Iguchi et al. | 438/624 |
| 6,323,121 B1 | 11/2001 | Liu et al. | 438/633 |
| 6,348,736 B1 | 2/2002 | McGahay et al. | 257/774 |
| 6,352,945 B1 | 3/2002 | Matsuki et al. | 438/778 |
| 6,362,109 B1 | 3/2002 | Kim et al. | 438/706 |
| 6,383,955 B1 | 5/2002 | Matsuki | 438/790 |
| 6,387,824 B1 * | 5/2002 | Aoi | 438/778 |
| 6,391,761 B1 * | 5/2002 | Lui | 438/618 |
| 6,410,463 B1 | 6/2002 | Matsuki | 438/790 |
| 6,432,846 B1 | 8/2002 | Matsuki | 438/790 |
| 6,455,445 B2 | 9/2002 | Matsuki | 438/789 |
| 6,458,705 B1 | 10/2002 | Hung et al. | 438/692 |
| 6,461,955 B1 * | 10/2002 | Tsu et al. | 438/618 |
| 6,465,358 B1 | 10/2002 | Nashner et al. | 438/700 |
| 6,509,267 B1 | 1/2003 | Woo et al. | 438/687 |
| 6,514,880 B2 | 2/2003 | Matsuki et al. | 438/780 |
| 6,559,520 B2 | 5/2003 | Matsuki et al. | 257/642 |
| 2001/0027002 A1 | 10/2001 | Matsumoto | 438/584 |
| 2001/0046778 A1 | 11/2001 | Wang et al. | 438/706 |
| 2002/0009873 A1 | 1/2002 | Usami | 438/620 |
| 2002/0031906 A1 * | 3/2002 | Jiang et al. | 438/622 |

FOREIGN PATENT DOCUMENTS

| | | |
|---|---|---|
| JP | 2002-043417 | 2/2002 |
| JP | 2002-313910 | 10/2002 |
| KR | 0029195 | 5/2000 |
| KR | 2000-0077104 | 12/2000 |
| KR | 10-0364053 | 11/2002 |
| WO | WO 02/071468 | 9/2002 |

* cited by examiner

LOW VIA-DENSITY REGION

HIGH VIA-DENSITY REGION

METHOD OF FABRICATING DUAL DAMASCENE INTERCONNECTIONS OF MICROELECTRONIC DEVICE USING HYBRID LOW K-DIELECTRIC AND CARBON-FREE INORGANIC FILLER

This application is a continuation-in-part (CIP) of application Ser. No. 10/081,661 filed on Feb. 22, 2002, now U.S. Pat. No. 6,828,229 Ser. No. 10/114,274 filed on Apr. 2, 2002 now U.S. Pat. No. 6,861,347 and Ser. No. 10/437,529, filed on May 14, 2003, now U.S. Pat. No. 6,855,629 assigned to the assignee of the present application, the contents of which are incorporated herein by reference in their entirety.

BACKGROUND OF THE INVENTION

1. Field of the Invention

The present invention relates to a microelectronic device, and more particularly, to a method of fabricating dual damascene interconnections of a microelectronic device.

2. Description of the Related Art

As microelectronic devices become more efficient and highly integrated, multi-layered interconnections are more widely used. To obtain a reliable device including multi-layered interconnections, each interconnection layer are formed in a planar fashion. Thus, dual damascene interconnections have become strongly relied upon.

Meanwhile, in today's highly integrated microelectronic devices, a design rule has been reduced to 0.18 µm or less, and even to 90 nm. Such a small design rule brings about increases in RC delay, cross talk, and power consumption. To solve these problems, an interlayer dielectric (ILD) should be formed of a low-k dielectric material layer. As a result, the need to further develop techniques of fabricating dual damascene interconnections using a low-k ILD has greatly increased.

Methods of fabricating dual damascene interconnections are disclosed in U.S. Pat. No. 6,057,239, and in J. Vac. Sci. Technol. A19 (2001) p. 1388, by P. Jiang et al. However, the method disclosed in U.S. Pat. No. 6,057,239 uses an ILD formed of only an oxide layer, a dielectric constant of which is about 4 to 4.3.

Also, when a trench is etched and cleaned, an etch stop layer may be etched to expose interconnections, thus degrading electrical properties of the interconnections. In the thesis by P. Jiang et al., before a trench is etched, a via is filled with an organic filler, such as a bottom anti-reflection layer (ARL), to prevent degradation of electrical properties. However, because both the organic filler and a photoresist pattern are organic materials having similar etch rates, the photoresist pattern is almost removed during etching of the organic filler formed on an ILD. Thus, when the ILD is etched to form a final trench, the photoresist pattern cannot be used as an etch mask. To prevent this problem, as shown in FIG. 1A, before a photoresist pattern 22 is formed, an organic filler 20 is etched using an etchback process until the organic filler 20 remains only in a via 19. However, this process is very complicated. In addition, as illustrated with dotted circles 24 in FIG. 1B, a low-k ILD 18 is not etched and remains on the organic filler 20 because of a difference in etch rate between the organic filler 20 and the low-k ILD 18. The remaining low-k ILD 18 generates fences 26 as shown in FIG. 1C. In FIGS. 1A and 1B, reference numeral 10 denotes a substrate, 12 denotes a lower ILD, 14 denotes lower interconnections, and 16 denotes an etch stop layer.

To prevent the fence defects, if the organic filler 20 is etched back by over-etching such that a portion of the via 19 is filled with the organic filler 20, a thickness deviation of a photoresist layer becomes very great between a high via-density region and a low via-density region. As a result, a depth of focus (DOF) margin decreases in a photolithographic process.

Further, during an exposure process for forming the photoresist pattern 22, basic materials, such as amine, may be diffused from the ILD 18 through the organic filler 20 to the photoresist layer, thereby resulting in photoresist poisoning.

Therefore, a method of fabricating reliable dual damascene interconnections without degrading electrical properties of a low-k ILD is required.

SUMMARY OF THE INVENTION

The present invention provides a method of fabricating reliable dual damascene interconnections in a low-k interlayer dielectric (ILD).

The present invention also provides a method of fabricating non-defective dual damascene interconnections.

In accordance with an aspect of the present invention, there is provided a method of fabricating dual damascene interconnections, which comprises (a) forming a hybrid dielectric layer having a dielectric constant of 3.3 or less on a substrate; (b) forming a via in the dielectric layer; (c) filling the via with a carbon-free inorganic filler; (d) partially etching the inorganic filler filling the via and the dielectric layer to form a trench, which is connected to the via and in which interconnections will be formed; (e) removing the inorganic filler remaining in the via; and (f) completing interconnections by filling the trench and the via with an interconnection material.

In accordance with another aspect of the present invention, there is provided a method of fabricating dual damascene interconnections, which comprises (a) forming an organo silicate glass layer on a substrate; (b) forming a via in the organo silicate glass layer; (c) filling the via with an HSQ-based filler; (d) partially etching the HSQ-based filler filling the via and the organo silicate glass layer to form a trench, which is connected to the via and in which interconnections will be formed; (e) removing the HSQ-based filler remaining in the via; and (f) completing interconnections by filling the trench and the via with an interconnection material.

Preferably, the organo silicate glass layer is formed using chemical vapor deposition (CVD).

In accordance with yet another aspect of the present invention, there is provided a method of fabricating dual damascene interconnections, which comprises (a) forming a lower interconnection on a substrate; (b) forming an etch stop layer on the lower interconnection; (c) forming an organo silicate glass layer using chemical vapor deposition (CVD) on the etch stop layer; (d) forming a via through the organo silicate glass layer to expose the etch stop layer; (e) filling the via with an HSQ-based filler; (f) processing the surface of the HSQ-based filler using plasma; (g) forming an anti-reflection layer (ARL) on the plasma-processed surface of the HSQ-based filler; (h) partially etching the ARL, the HSQ-based filler filling the via, and the organo silicate glass layer to form a trench, which is connected to the via and in which interconnections will be formed; (i) removing the HSQ-based filler remaining in the via; and (k) completing interconnections by filling the trench and the vias with an interconnection material.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1A:
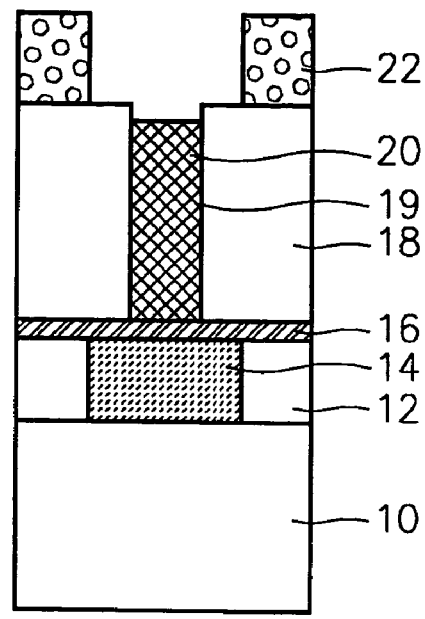
FIGS. 1A through 1C are cross-sectional views and a scanning electron microscope (SEM) image illustrating a conventional method of fabricating conventional dual damascene interconnections.

In the present invention, an interlayer dielectric (ILD) may be formed of a hybrid low-k dielectric material. The hybrid low-k dielectric material has advantages of both organic and inorganic materials. The hybrid low-k dielectric material shows low-k characteristics like an organic material. Also, the hybrid low-k dielectric material can be formed using a conventional apparatus and process since it has a modified structure from a conventional inorganic silicate oxide. And, the hybrid low-k dielectric material is thermally stable like an inorganic material. In particular, when the ILD is formed of a hybrid low-k dielectric material, whose dielectric constant is 3.3 or lower, RC delay is prevented and cross talk and power consumption can be minimized.

In the embodiments of the present invention, a via filler may be formed of a material which has a good gap filling characteristic and which has an etch rate substantially equal to that of a low-k ILD, or has a high etch selectivity with respect to the low-k ILD, depending on etching methods or conditions. In particular, the via filler may be formed of a carbon-free inorganic material so that it can be dry etched at the same etch rate as the ILD and wet etched at a much higher rate than the ILD. Also, the via filler may be formed of a material that can function as a barrier layer to basic materials, such as nitrogen and amine. In specific embodiments of the present invention, a via filler may be formed of a material comprising a light absorption material or a dissolution inhibitor for a photoresist developing solution. Thus, an etch stop layer for protecting a lower interconnection is not damaged, photoresist poisoning is prevented, a DOF margin is improved in a photolithographic process, and fence defects, which adversely affect electrical properties of dual damascene interconnections, are prevented. Further, robust and reliable dual damascene interconnections can be fabricated, without increasing the critical dimension of a trench.

The present invention can be applied to microelectronic devices, such as highly integrated circuit semiconductor devices, processors, micro electromechanical (MEM) devices, optoelectronic devices, and display devices. In particular, the present invention is highly useful for devices requiring high-speed characteristics, such as central processing units (CPUs), digital signal processors (DSPs), combinations of a CPU and a DSP, application specific integrated circuits (ASICs), logic devices, and SRAMs.

Herein, an opening exposing a lower interconnection is referred to as a via, and a region where interconnections will be formed is referred to as a trench. Hereinafter, the present invention will be described by way of an example of a via-first dual damascene process, in which, even if misalignment occurs, the size of a via can be held constant.

Hereinafter, a method of fabricating dual damascene interconnections according to an embodiment of the present invention will be described with reference to FIGS. 2 through 13.

Figure 2:
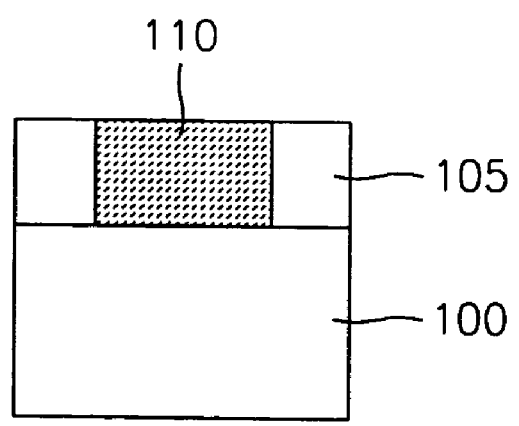
FIGS. 2 through 13 are cross-sectional views illustrating a method of fabricating dual damascene interconnections according to an embodiment of the present invention.

As shown in FIG. 2, a substrate 100 is prepared. A lower ILD 105 including a lower interconnection 110 is formed on the substrate 100. The substrate 100 may be, for example, a silicon substrate, a silicon on insulator (SOI) substrate, a gallium arsenic substrate, a silicon germanium substrate, a ceramic substrate, a quartz substrate, or a glass substrate for display. Various active devices and passive devices may be formed on the substrate 100. The lower interconnection 110 may be formed of various interconnection materials, such as copper, copper alloy, aluminium, and aluminium alloy. The lower interconnection 110 is preferably formed of copper because of its low resistance. Also, the surface of the lower interconnection 110 is preferably planarized.

Figure 3:
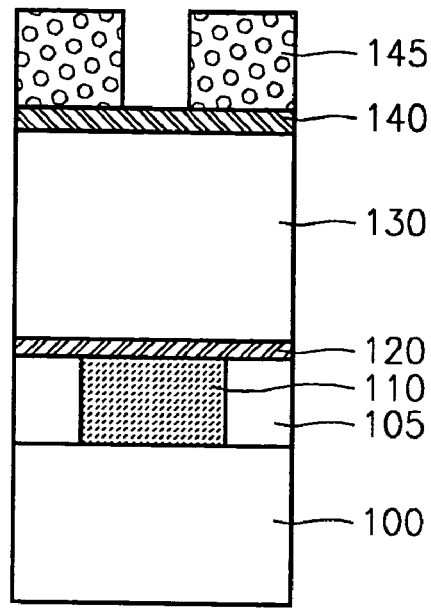

Referring to FIG. 3, an etch stop layer 120, a low-k ILD 130, and a capping layer 140 are sequentially stacked on the surface of the substrate 100 where the lower interconnection 110 is formed, and a photoresist pattern 145 is formed on the capping layer 140 to define a via.

The etch stop layer 120 is formed to prevent electrical properties of the lower interconnection 110 from being damaged during a subsequent dry etch process for forming a via and a subsequent wet etch process for removing the remaining filler. Accordingly, the etch stop layer 120 is formed of a material having a high etch selectivity with respect to the ILD 130 formed thereon. Preferably, the etch stop layer 120 is formed of SiC, SiN, or SiCN, having a dielectric constant of 4 to 5. The etch stop layer 120 is as thin as possible in consideration of the dielectric constant of the entire ILD, but thick enough to properly function as an etch stop layer.

The ILD 130 is formed of a hybrid low-k dielectric material, which has advantages of organic and inorganic materials. That is, the ILD 130 formed of the hybrid low-k dielectric material has low-k characteristics, can be formed using a conventional apparatus and process, and is thermally stable. The ILD 130 is formed of a hybrid material having a dielectric constant of 3.3 or less, to prevent an RC delay between the lower interconnection 110 and dual damascene interconnections and minimize cross talk and power consumption. Most preferably, the ILD 130 is formed of low-k organo silicate glass (OSG). The ILD 130 formed of low-k OSG can be formed using chemical vapor deposition (CVD), more specifically, plasma-enhanced CVD (PECVD). As the carbon content in an OSG layer increases, the dielectric constant of the OSG layer decreases but thermal and mechanical characteristics are degraded. However, if an OSG layer is formed using CVD, the carbon content in the OSG layer can be adjusted to appropriately control the dielectric constant and thermal and mechanical characteristics of the OSG layer. Therefore, an OSG layer formed using CVD is suitable for the ILD 130. It is obvious that various changes may be made by known methods in the source gas (e.g., carbon source gas, silicon source gas, and oxygen source gas), a CVD chamber, and fabricating conditions (e.g., temperature and time conditions) used for forming the OSG layer using CVD. A method of forming OSG using CVD may be a known method or methods disclosed in U.S. Pat. Nos. 6,455,445, 6,432,846, 6,514,880, 6,559,520, 6,352,945, 6,383,955, and 6,410,463, and Korean Patent No. 0364053, in their entirety as fully disclosed in the present invention. The ILD 130 is formed to a thickness of 3000 Å to 20000 Å, preferably, 6000 Å to 7000 Å. However, the ILD 130 can be formed to various thicknesses by those skilled in the art.

Meanwhile, when dual damascene interconnections are planarized using chemical mechanical polishing (CMP), the capping layer 140 prevents the ILD 130 from being damaged by the CMP. Thus, the capping layer 140 is formed of $SiO_2$, SiOF, SiON, SiC, SiN, or SiCN. Preferably, the capping layer 140 functions as an anti-reflection layer (ARL) in a subsequent photolithographic process for forming a trench. Accordingly, the capping layer 140 is more preferably formed of $SiO_2$, SiON, SiC, or SiCN. However, if damage to the ILD 130 can be prevented by controlling the CMP process and an anti-reflective material layer is formed in a subsequent process, the formation of the capping layer 140 may be optionally omitted.

The photoresist pattern 145 is formed by forming a layer of a photoresist that is suitable for a light source of 248 nm or less and then performing exposure and developing processes using a photo mask defining a via.

Figure 4:
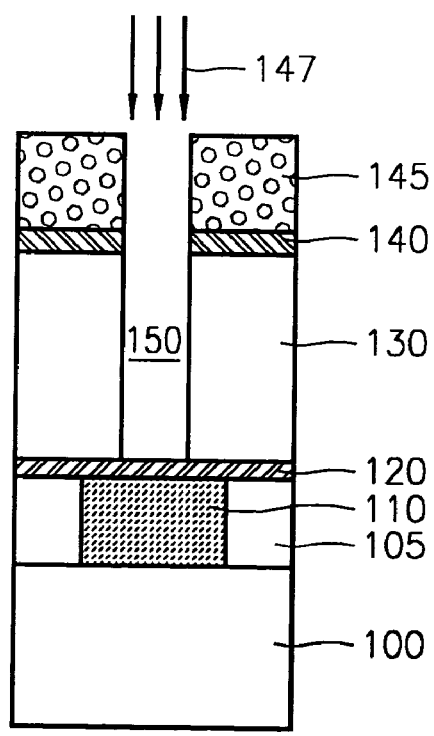

Referring to FIG. 4, the ILD 130 is dry etched (147) using the photoresist pattern 145 as an etch mask to form a via 150. The ILD 130 is etched using a reactive ion beam etch (RIE) process, which uses a mixture of a main etch gas (e.g., CxFy and CxHyFz), an inert gas (e.g. Ar gas), and optionally at least one of $O_2$, $N_2$, and COx. Here, the RIE conditions are adjusted such that only the ILD 130 is selectively etched and the etch stop layer 120 is not etched.

Figure 5:
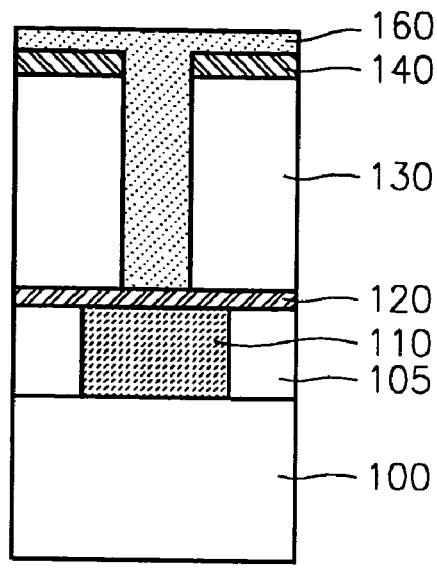

Referring to FIG. 5, the photoresist pattern 145 is removed and the via 150 is filled with a via filler 160. The photoresist pattern 145 is processed using an $H_2$-based plasma and removed using a stripper. $H_2$-based plasma refers to plasma obtained from $H_2$, $N_2/H_2$, $NH_3/H_2$, $NH_3/H_2$, $He/H_2$, or a mixture thereof. If the photoresist pattern 145 is removed using $O_2$-ashing, which is widely used for removing a photoresist pattern, the ILD 130 containing carbon to have organic properties may be damaged by the $O_2$-based plasma. Thus, the photoresist pattern 145 is preferably removed using an $H_2$-based plasma.

The via filler 160 is formed of a material that has a good gap filling characteristic. Also, a dry etch ratio of the via filler 160 to the ILD 130 is either about 1:1 or 4:1 or less. Further, the via filler 160 is formed of a material that is etched at a higher etch rate than the ILD 130 in a subsequent wet etch process. Preferably, the via filler 160 is formed of a material having such a characteristic that a wet etch ratio of the via filler 160 to the ILD 130 is 20:1 or higher. Also, during an exposure process for forming a photoresist pattern to define a subsequent trench, basic materials, such as nitrogen and amine, included in the ILD 130, may diffuse into a photoresist layer. Thus, the via filler 160 is formed of a material that can prevent the diffusion of the basic material into the photoresist layer. That is, the via filler 160 is preferably formed of a carbon-free inorganic material to have a dry etch rate being substantially equal to that of the ILD 130, which is a hybrid of an organic material and an inorganic material, and a wet etch rate being much higher than that of the ILD 130. Given the foregoing conditions, HydrogenSilsesQuioxane (HSQ) is the most suitable for the via filler 160 among carbon-free inorganic materials.

Further, the via filler 160 preferably includes a light absorption material or a dissolution inhibitor. The dissolution inhibitor, which inhibits dissolution of a photoresist developing solution, may be a material known by those skilled in the art. The functions of the light absorption material and the dissolution inhibitor will be described later. In the present invention, HSQ-based materials refer to not only pure HSQ but also HSQ including additives, such as a light absorption material and/or a dissolution inhibitor.

The via filler 160 is formed using spin coating to completely fill the via 150. While it is possible to fill only the via 150 with the via filler 160, the via filler 160 is preferably formed on the capping layer 140 to a predetermined thickness in consideration of process margin control. Also, it is preferable in terms of a DOF margin that a difference between the height T1 of the via filler 160 formed in a low via-density region and the height T2 of the via filler 160 formed in a high via-density region is 2000 Å or less. The thickness of HSQ-based materials can be easily controlled in consideration of variables such as coating recipe, the space between vias 150, the critical dimension, and the height of the via 150, and the condition (T1–T2≦2000 Å) can be easily satisfied.

Figure 6:
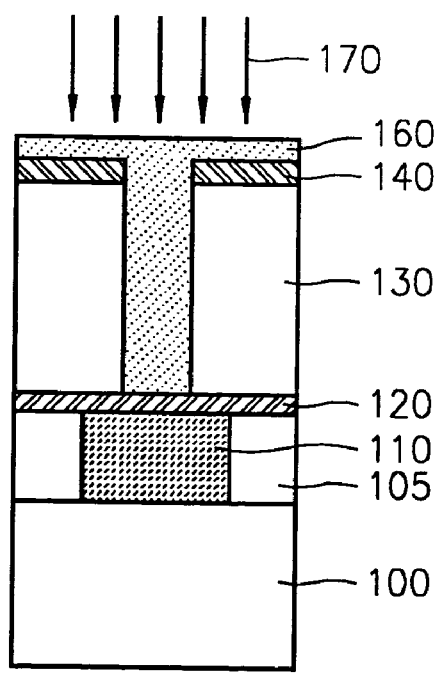

Referring to FIG. 6, the surface of the via filler 160 is processed using plasma 170. The plasma 170 is derived from $O_2$, $H_2$, He, $NH_3$, $N_2$, Ar, or any mixture thereof, and the plasma processing is conducted at a temperature of room temperature to 500° C. for 1 to 120 seconds. The surface of the via filler 160 is densified by the plasma processing. Also, the plasma processing is carried out to prevent a photoresist developing solution from dissolving the via filler 160. Accordingly, if the via filler 160 includes a dissolution inhibitor, the plasma processing may be optionally omitted.

Figure 7:
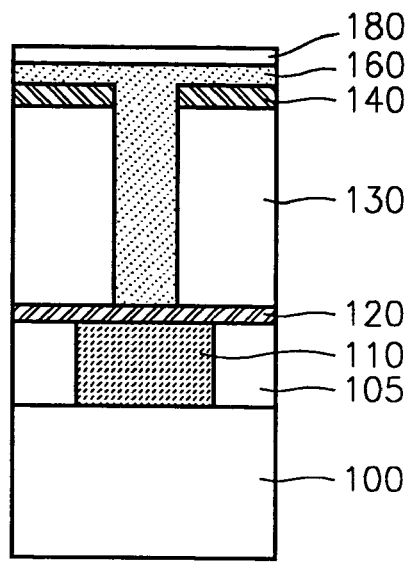

Referring to FIG. 7, an anti-reflection layer (ARL) 180 is formed on the via filler 160, which is processed using plasma 170. Although it is possible to form the ARL 180 using an inorganic material, the ARL 180 is preferably formed of an organic material in order to be easily removed later. The ARL 180 is formed of an anti-reflective material that can absorb light of a wavelength 248 nm, 193 nm, or less, which is known to those skilled in the art, or a material that is disclosed in U.S. patent application Ser. No. 10/400,029, commonly owned by the same assignee and is incorporated herein by reference in its entirety as fully disclosed in the present invention. The ARL 180 is formed to a thickness of 500 Å to 700 Å.

Figure 8:
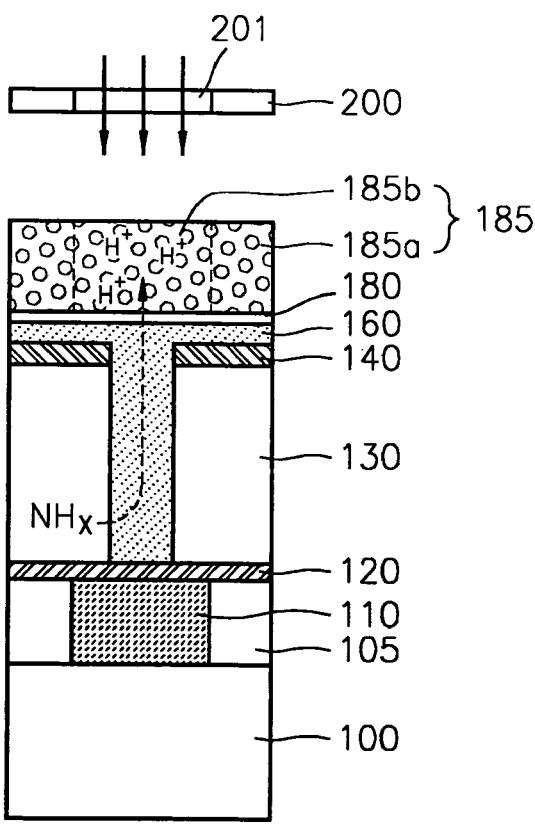

Referring to FIG. 8, a photoresist layer 185 is formed and then exposed to light using a mask 200 defining a trench. When the light emitted from an exposure source with a wavelength of 248 nm, 193 nm, or less is transmitted through a transmission region 201 of the mask 200 and radiated onto the photoresist layer 185, acids H+ are generated from a photo acid generator included in an exposure portion 185b of the photoresist layer 185. Here, the ARL 180, disposed under the exposure portion 185b, prevents rays penetrating the photoresist layer 185 from being reflected back to the photoresist layer 185. Accordingly, if the via filler 160 includes a light absorption material to prevent the reflection of rays, the formation of the ARL 180 may be optionally omitted. The acids H+ generated in the exposure portion 185b hydrolyze the photoresist layer 185 into a material soluble in a developing solution. After the exposure process, acidolysis becomes more active by a post-exposure baking (PEB) process. During the exposure process and the PEB process, the via filler 160 functions as a diffusion barrier layer to nitrogen or amine. Accordingly, basic materials, such as nitrogen and amine, which remain in the ILD 130 due to etch gas used for etching the via 150 as well as the plasma processing for removing the photoresist pattern (145 of FIG. 4) defining the via 150, cannot diffuse as depicted in a dotted line through the via filler 160 and neutralize the acids H+ generated in the exposure portion 185*b*, since the via filler 160 functions as the diffusion barrier layer, thereby resulting in no photoresist poisoning.

Figure 9:
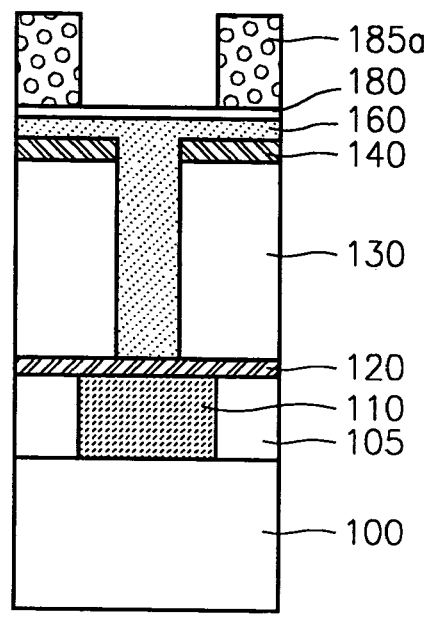

Referring to FIG. 9, a photoresist pattern 185*a* is formed. When the post-exposure baked photoresist layer 185 is soaked in a tetramethyl ammonium hydroxide developing solution, only the exposure portion 185*b* is dissolved in the developing solution. Thus, as shown in FIG. 9, the photoresist pattern 185*a* is obtained. Here, the via filler 160 is not exposed to the developing solution due to the ARL 180 disposed under the exposure portion 185*b*. If the via filler 160 is processed using plasma or includes a dissolution inhibitor, it is not damaged by the developing solution even without the ARL 180.

Figure 1B:
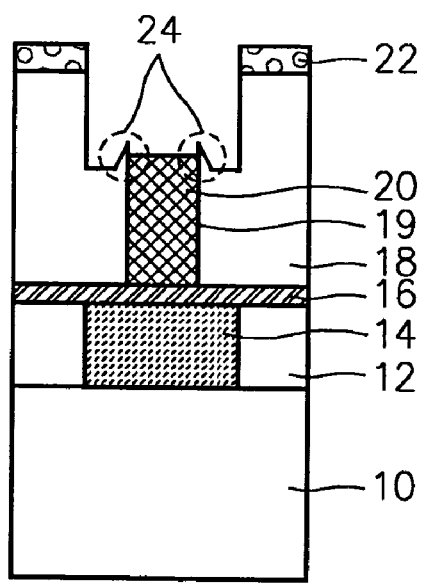
Figure 1C:
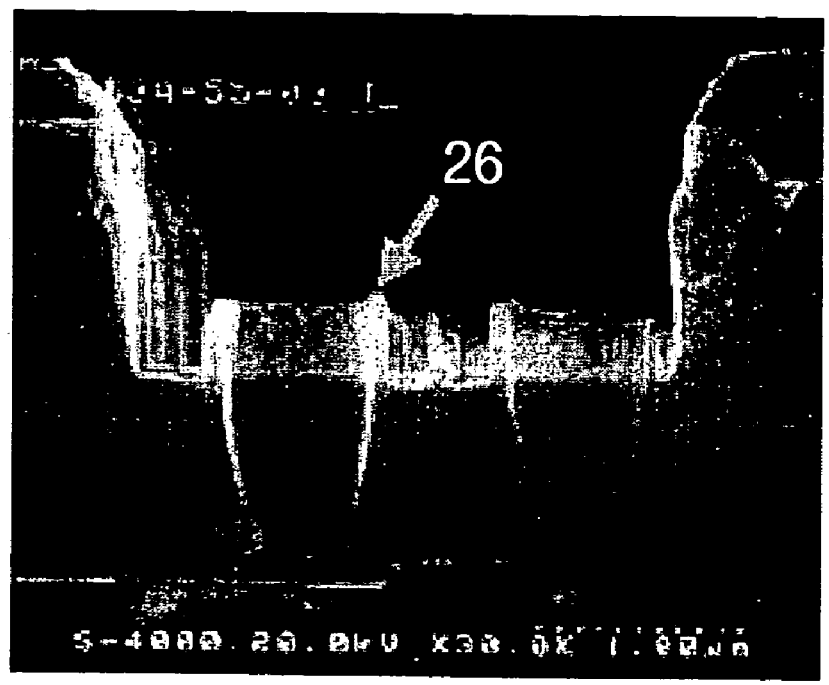
Figure 10:
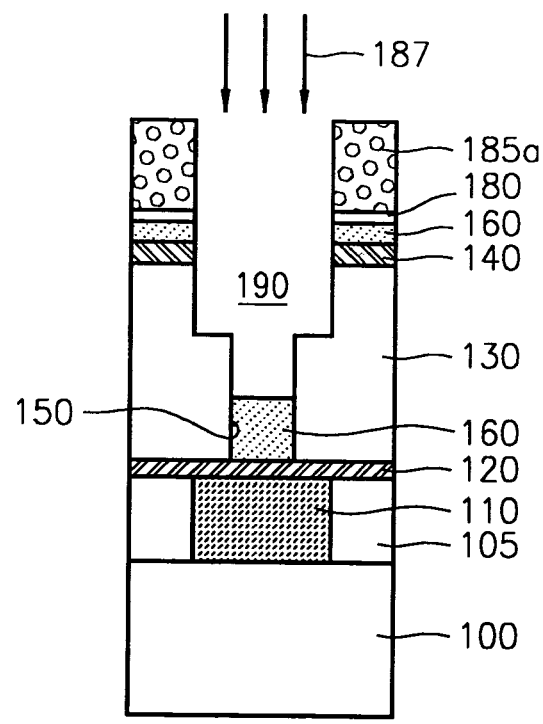

FIG. 10 shows the formation of a trench 190. The ARL 180, the via filler 160, and the capping layer 140 are sequentially etched using the photoresist pattern 185 as an etch mask, and then the ILD 130 and the via filler 160 are etched to a predetermined depth, thereby forming the trench 190. The trench 190 is dry etched on condition that an etch ratio of the ILD 130 to the via filler 160 is 1:1, or 4:1 or less. Therefore, fence defects (see FIG. 1) can be prevented and, since a portion of the via filler 160 still remains in the via 150, it can prevent the etch stop layer 120 from being etched to damage the lower interconnection 110. If the ILD 130 is formed of an OSG and the via filler 160 is formed of an HSQ-based material, both of them have characteristics of inorganic materials. Thus, if an RIE process is carried out using a mixture of a main etch gas (e.g., $C_xF_y$ and $C_xH_yF_z$), an inert gas (e.g. Ar gas), and optionally at least one of $O_2$, $N_2$, and $CO_x$, the foregoing condition for etching the trench 190 can be satisfied.

Figure 11:
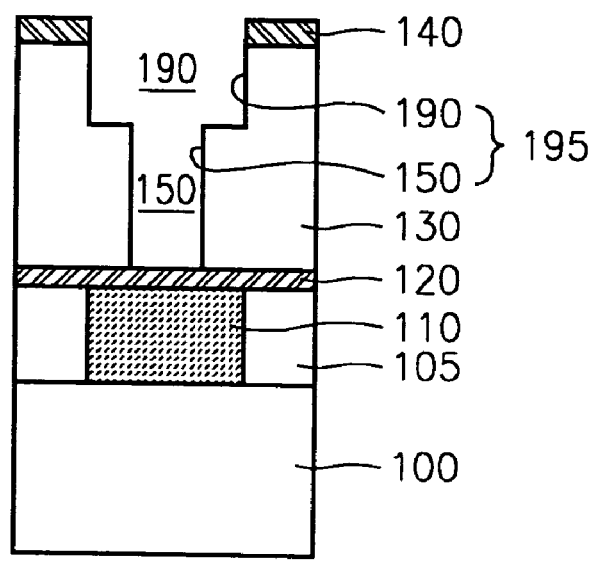

FIG. 11 is a cross-sectional view of the resultant structure, from which the photoresist pattern 185*a* and the remaining via filler 160 are removed. After the etching of the trench 190 is completed, the photoresist pattern 185*a* is removed using $H_2$-based plasma obtained from $H_2$, $N_2/H_2$, $NH_3/H_2$, $NH_3/H_2$, $He/H_2$, or a mixture thereof. Next, the via filler 160 is removed, thereby forming a dual damascene interconnection region 195, which includes the via 150 and the trench 190. The via filler 160 is removed using a wet etch process. The wet etch process for removing the via filler 160 is carried out on condition that the ILD 130 is only slightly etched and only the via filler 160 is selectively removed, i.e., that a wet etch ratio of the via filler 160 to the ILD 130 is 20:1 or higher. Also, the via filler 160 should have an etch selectivity with respect to the etch stop layer 120. While the ILD 130 has organic characteristics, the via filler 160 and the etch stop layer 120 are formed of inorganic materials. Thus, to satisfy the condition, the via filler 120 is removed by wet etching using an etchant having a high selectivity with respect to organic materials. In particular, if the via filler 160 is formed of an HSQ-based material, the ILD 130 is formed of an OSG, and the etch stop layer 160 is formed of SiC(N), the via filler 160 may be wet etched in an HF solution diluted with deionized water (DIW), or a buffered oxide etchant (BOE), which is a mixture of $NH_4$, HF, and deionized water. Preferably, the diluted HF solution is in a ratio of 100(DIW): 1(HF) or higher. Thus, an etch ratio of HSQ-based material to OSG to SiC(N) can be higher than 100:1:1. In addition, etching of the ILD 130 can be prevented during the removal of the via filler 160 so as to precisely control the critical dimension of the trench 190.

A detailed description of the via etching, the trench etching, and the wet etching is given in Korean Patent Application No. 2002-57192, commonly owned by the same assignee and incorporated herein by reference in its entirety as fully disclosed in the present invention.

Figure 12:
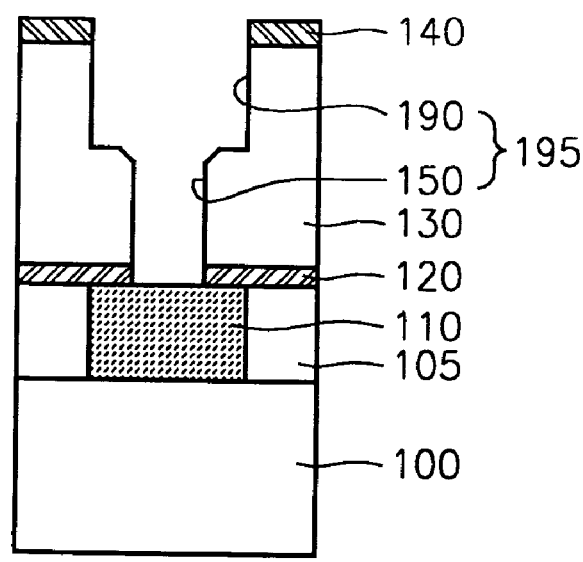

Referring to FIG. 12, the etch stop layer 120 exposed in the via 150 is etched until the lower interconnection 110 is exposed, thereby completing the dual damascene interconnection region 195. The etch stop layer 120 is etched so that the lower interconnection 110 is not affected and only the etch stop layer 120 is selectively removed.

Figure 13:
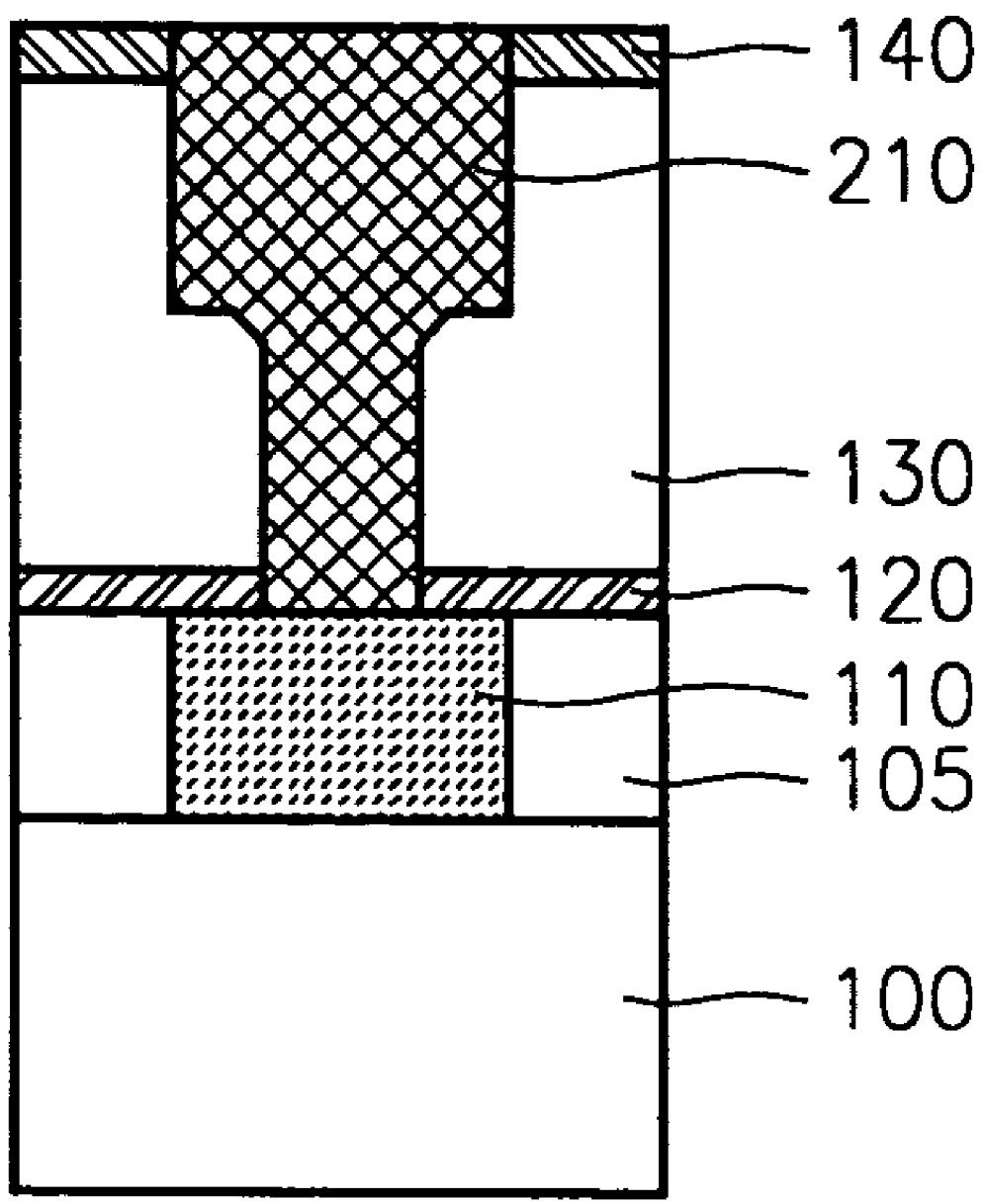

Referring to FIG. 13, a conductive layer is formed on the dual damascene interconnection region 195 and then planarized, thereby forming a dual damascene interconnection 210. The conductive layer is formed of aluminum, tungsten, copper, or any alloy thereof, and most preferably formed of copper because of its low resistance. Also, the conductive layer may be a stack of a diffusion barrier layer and a main interconnection layer, or may be embodied in various other forms by known methods.

It is obvious that the via-first dual damascene process described with reference to FIGS. 2 through 13 can be applied to a trench-first dual damascene process.

The present invention will be described in more detail with reference to the following experimental examples. Here, it is obvious that the present invention is not limited to the experimental examples.

The following experimental examples were obtained in a process of fabricating dual damascene interconnections of a 90 nm-design-rule logic device with embedded 1.1 $\mu m^2$ 6Tr-SRAM.

EXPERIMENTAL EXAMPLE 1

Figure 14A:
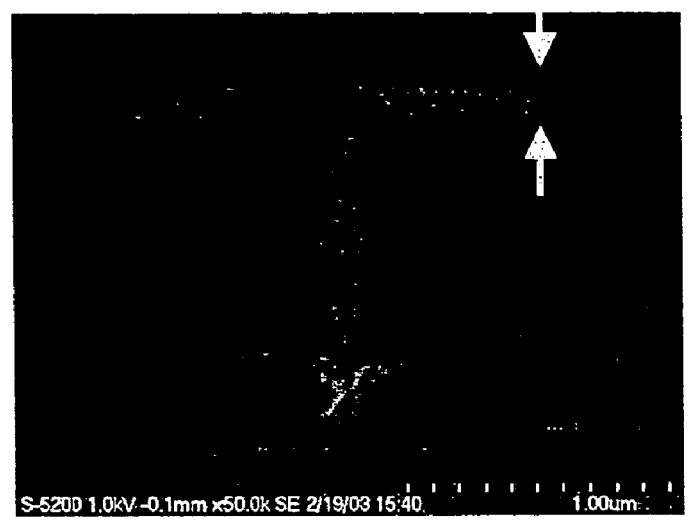
FIGS. 14A, 14B, 15A, 16A, 17A, 17B, 18 and 19 are SEM images showing a test sample fabricated according to the present invention.
Figure 14B:
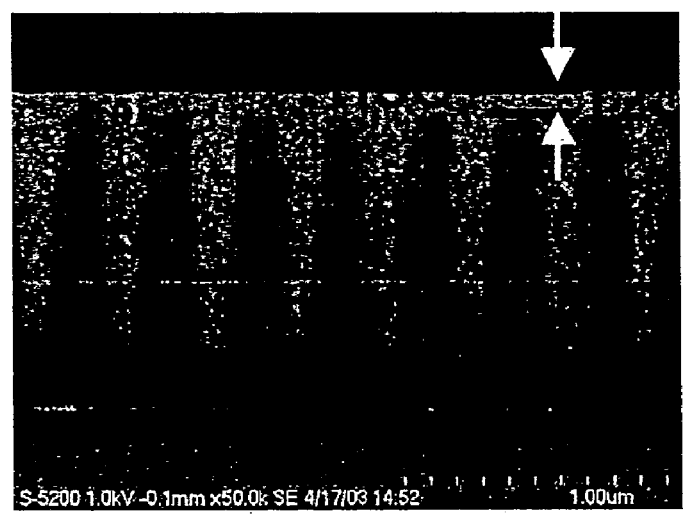

An etch stop layer was formed using SiC(k=5.0), an ILD was formed of CVD OSG(k=2.9) to a thickness of 7000 Å, and a via having a diameter of 0.132 μm was formed. Next, HSQ(Fox™ of Dow Corning Corp.) for a via filler was formed using spin coating. FIGS. 14A and 14B are SEM images showing cross-sectional views of a test sample, in which the HSQ via filler is filled. Referring to FIGS. 14A and 14B, it can be seen that the HSQ had a good gap filling characteristic and was formed in a planar fashion on an OSG layer. Also, a difference between the thickness T1 (FIG. 14A) of the HSQ layer formed in the low via-density region and the thickness T2 (FIG. 14B) of the HSQ layer formed in the high via-density region was 2000 Å or less.

EXPERIMENTAL EXAMPLE 2

An HSQ layer was formed in the same manner as in Experimental example 1, and then an organic ARL and a photoresist for KrF were sequentially formed on the HSQ layer. An exposure process was conducted using an exposure source with a wavelength of 248 nm and a development process was carried out using a tetramethyl ammonium hydroxide developing solution, thereby forming a photoresist pattern defining a trench. As a result, a test sample was prepared.

A contrastive sample was prepared by forming a photoresist pattern defining a trench directly on an HSQ layer.

Figure 15A:
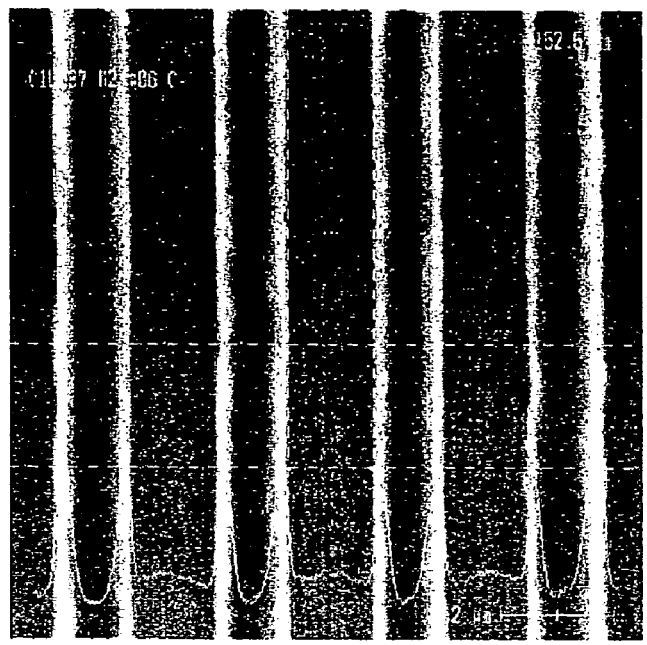
Figure 15B:
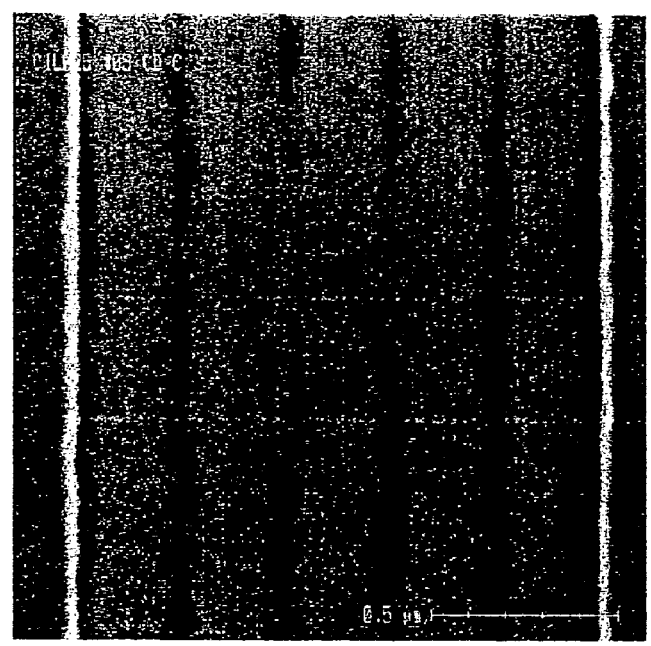
FIGS. 15B and 16B are SEM images showing a contrastive sample according to a conventional method.

FIG. 15A is an SEM image of the test sample, while 15B is an SEM image of the contrastive sample. FIGS. 15A and 15B confirm that a reliable photoresist pattern was obtained by forming an organic ARL.

EXPERIMENTAL EXAMPLE 3

An HSQ layer was formed in the same manner as in Experimental example 1, the surface of the HSQ layer was processed using plasma, and an organic ARL was formed. Next, a photoresist for KrF was coated on the organic ARL. An exposure process was conducted using an exposure source with a wavelength of 248 nm and a development process was carried out using a tetramethyl ammonium hydroxide developing solution, thereby forming a photoresist pattern defining a trench. As a result, a test sample was prepared.

A contrastive sample was prepared by using an organic ARL for a via filler in place of an HSQ layer and forming a photoresist pattern.

Figure 16A:
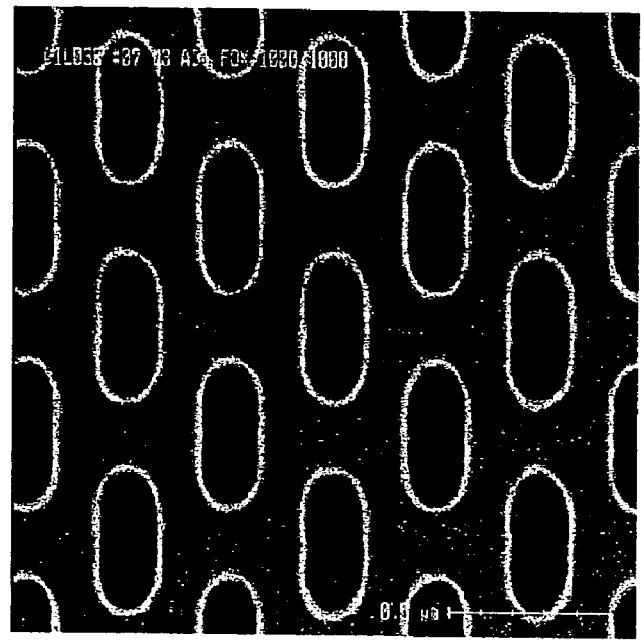
Figure 16B:
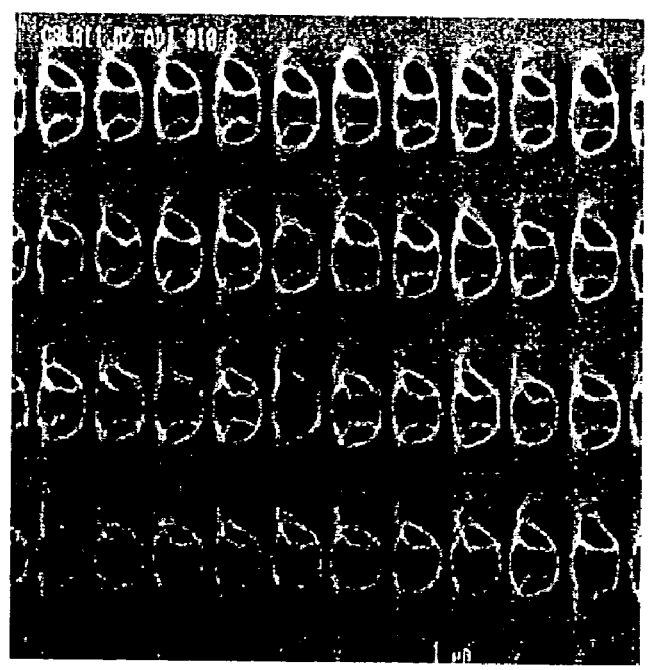

FIG. 16A is an SEM image of the test sample, while 16B is an SEM image of the contrastive sample. Referring to FIG. 16A, the HSQ via filler functioned as a diffusion barrier layer to basic materials, such as amine, so that a reliable photoresist pattern could be formed. In contrast, referring to FIG. 16B, when the organic ARL was used as the via filler, basic materials diffused and neutralized acids H+ in a photoresist layer, thereby forming a damaged photoresist pattern.

EXPERIMENTAL EXAMPLE 4

Figure 17A:
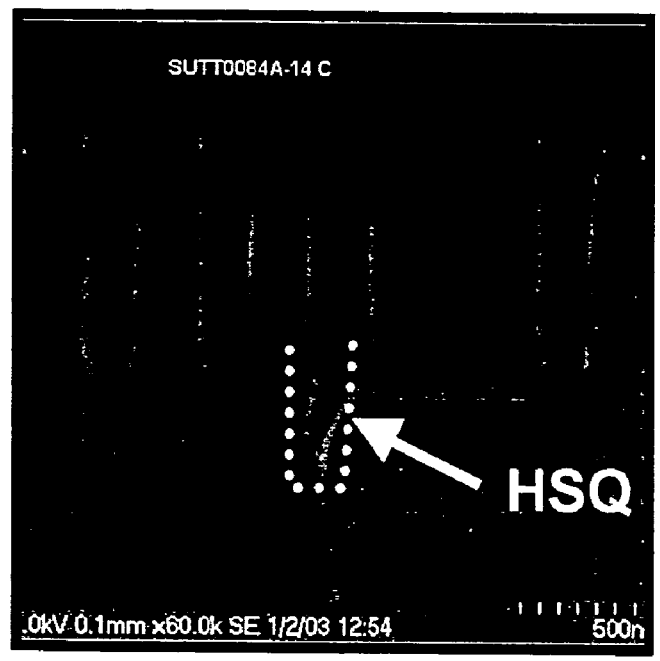
Figure 17B:
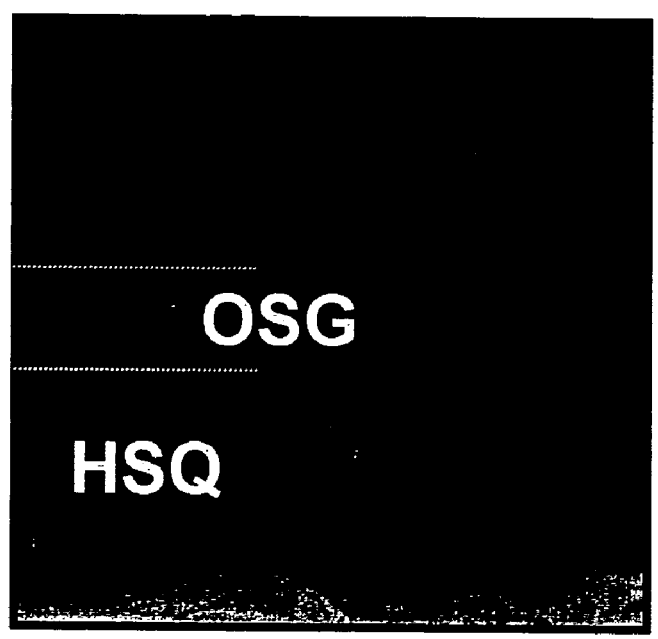

A photoresist pattern was formed in the same manner as in Experimental example 3, and a trench was formed by performing a dry etch process using a CxFy main etch gas such that an etch ratio of HSQ:OSG was 1:1. Thus, a test sample was prepared. FIGS. 17A and 17B are SEM images of the test sample. FIG. 17A is a cross-sectional view taken along the width of the trench, while FIG. 17B is a cross-sectional view taken along the length of the trench. Referring to FIGS. 17A and 17B, it can be seen that a good trench profile was formed in a dual damascene region, and although over-etching of about 50% occurred, the HSQ via filler reliably protected a SiC etch stop layer.

EXPERIMENTAL EXAMPLE 5

Figure 18:
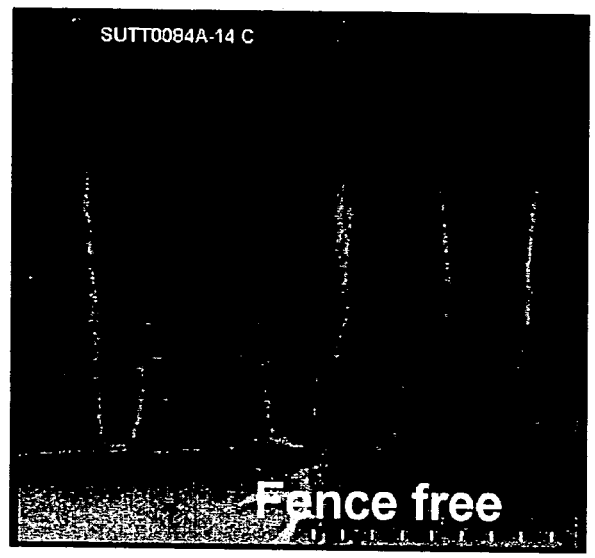

A trench was formed in the same manner as in Experimental example 4, an HSQ layer remaining in a via was removed using a diluted HF solution in a ratio of 500(DIW):1(HF). Thus, a test sample was prepared. FIG. 18 is an SEM image of the test sample. Referring to FIG. 18, the HSQ layer was completely removed, and a robust and reliable dual damascene region having a good profile and a desired critical dimension was formed without generation of fences.

EXPERIMENTAL EXAMPLE 6

Figure 19:
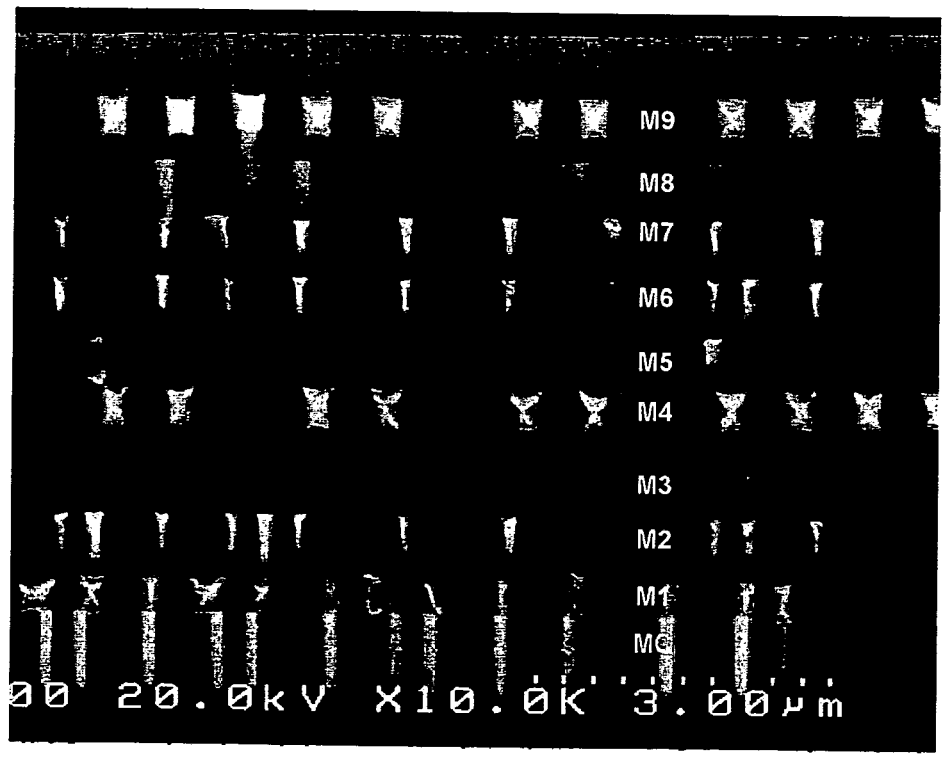

A dual damascene region was formed according to a process of fabricating a test sample as in Experimental examples 1–5, and a copper interconnection was formed in the dual damascene region, using a typical copper interconnection fabrication process. The dual damascene interconnection fabrication process was repeated two or more times, thereby completing 9-level dual damascene interconnections of a 90 nm-design-rule logic device with embedded 1.1 $\mu m^2$ 6Tr-SRAM. FIG. 19 is an SEM image of the logic device. FIG. 19 confirms that non-defective and reliable devices with a fine design rule can be fabricated according to the method of the present invention.

EXPERIMENTAL EXAMPLE 7

Electrical characteristics of the device fabricated in Experimental example 6 were measured. FIGS. 20 through 24 show the results.

Figure 20:
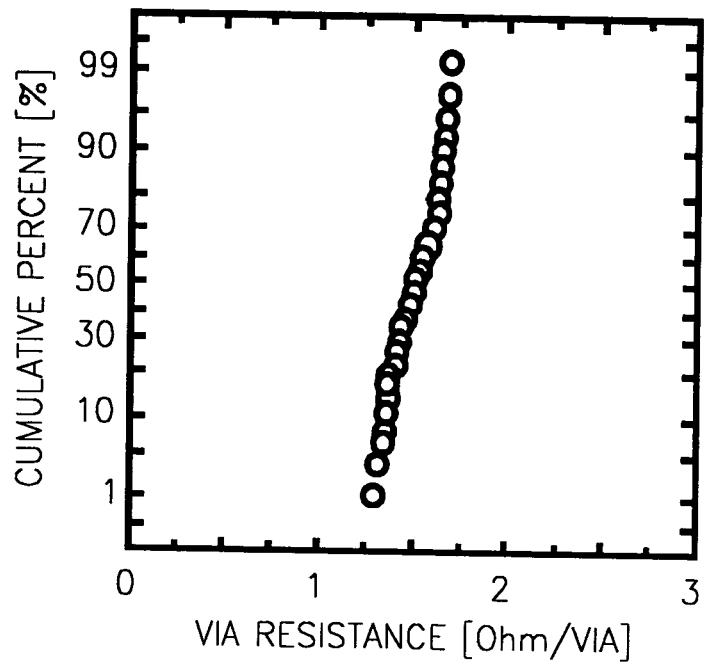
FIGS. 20 through 24 are graphs showing electrical properties of a device fabricated according the present invention.
Figure 21:
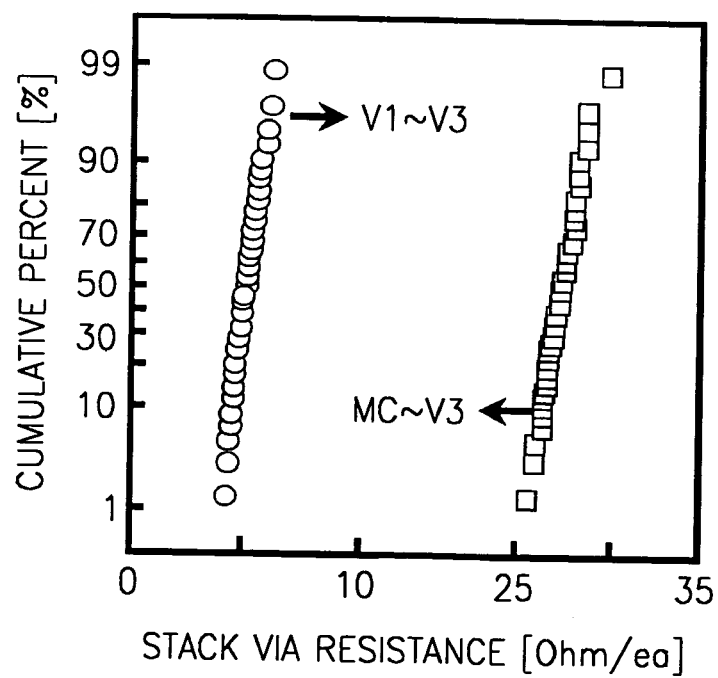

Referring to FIGS. 20 and 21, it can be seen that the resulting dual damascene structure had good via resistance characteristics.

Figure 22:
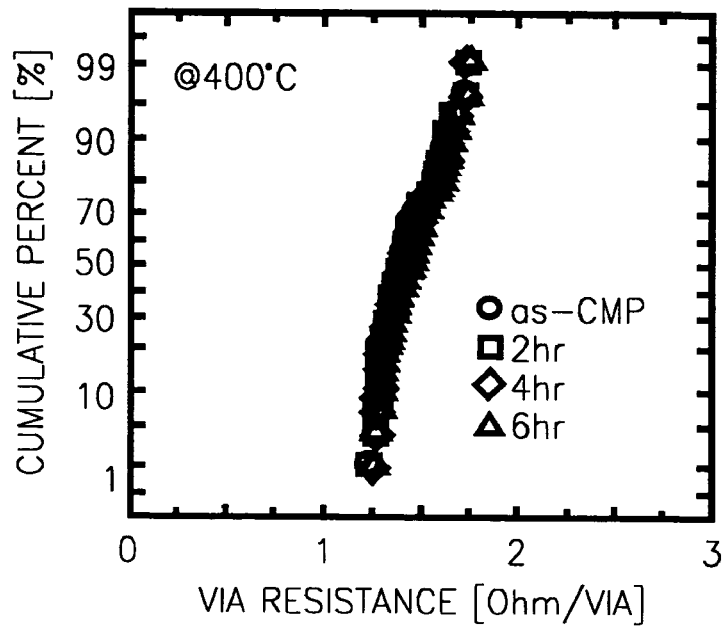

Referring to FIG. 22, it can be seen that even if the resulting device was annealed at a temperature of 400° C. for 6 hours, the via resistance characteristics were not degraded.

Figure 23:
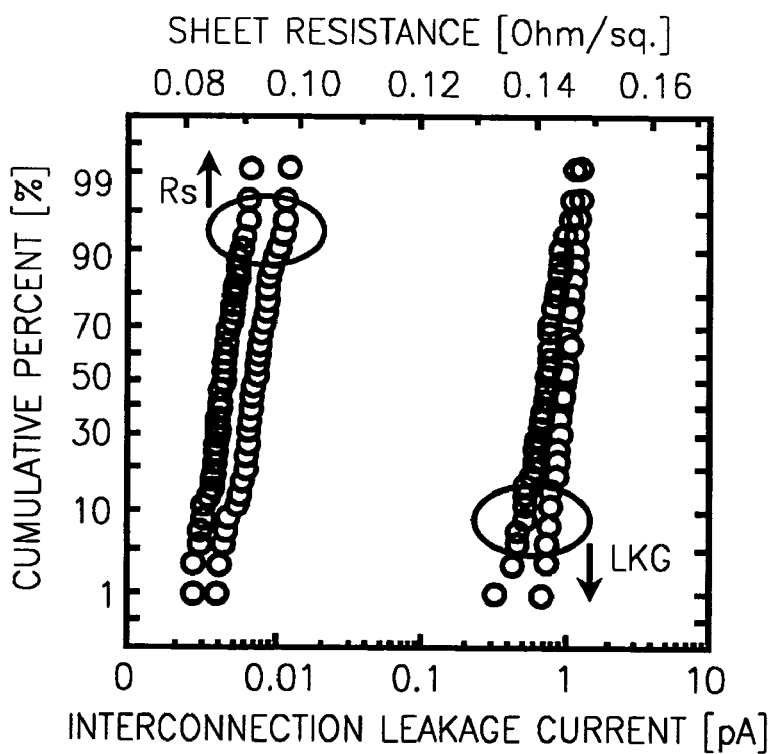

In another method, a device was formed in the same manner as in Experimental example 6, except that the line and the space of interconnections were changed to 0.14 μm and 0.12 μm, respectively. FIG. 23 shows results of measuring sheet resistance and leakage current of the interconnections.

Referring to FIG. 23, the sheet resistance and the leakage current were in good condition.

Figure 24:
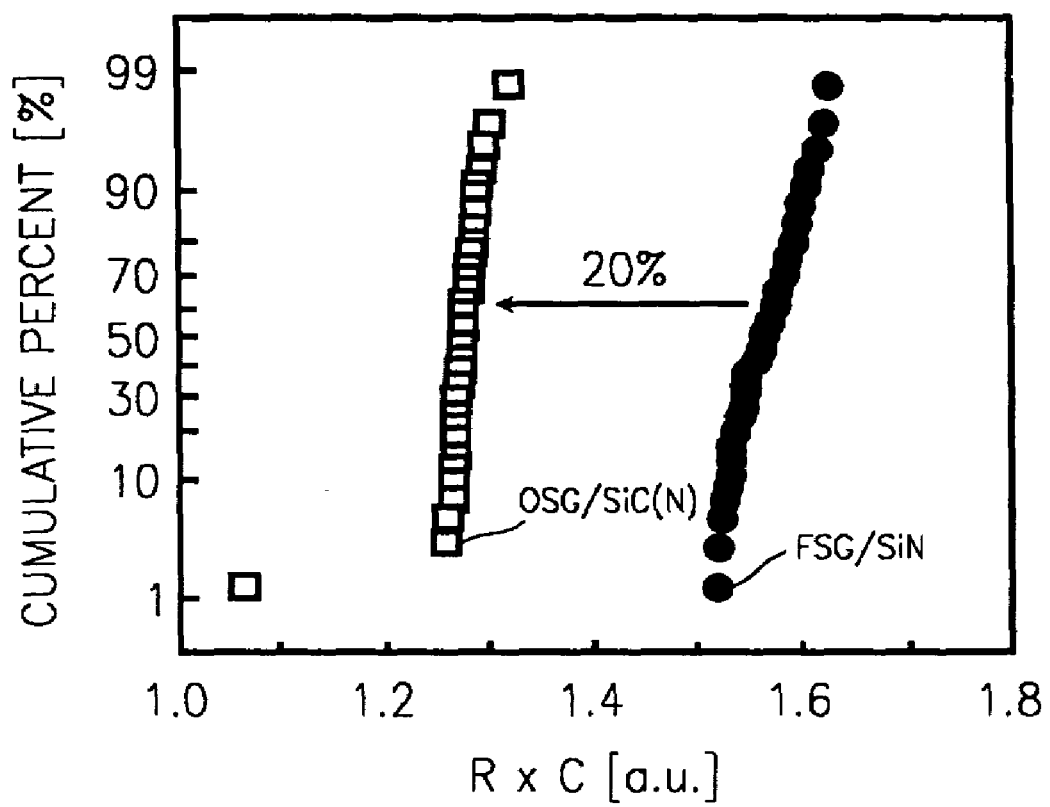

FIG. 24 shows an RC value of the device fabricated according to Experimental example 6 and an RC value of a device in which an etch stop layer is formed of SiN and an ILD is formed of SiOF.

Referring to FIG. 24, when the etch stop layer was formed of SiC and the ILD was formed of OSG as in the present invention, an RC value was reduced to about 20% compared with the conventional device in which the etch stop layer is formed of SiN and the ILD is formed of SiOF.

According to the present invention, an ILD is formed of a low-k dielectric material such that an RC delay is prevented and cross talk and power consumption can be minimized. Also, the ILD is formed of a hybrid low-k dielectric material and a via filler is formed of a carbon-free inorganic material. As a result, an etch stop layer covering a lower interconnection is protected, photoresist poisoning is prevented, a DOF margin is improved in a photolithographic process, fences, which may adversely affect electrical properties of dual damascene interconnections, are prevented, and the width and the critical dimension of a trench can be held constant.

While the present invention has been particularly shown and described with reference to preferred embodiments thereof, it will be understood by those of ordinary skill in the art that various changes in form and details may be made therein without departing from the spirit and scope of the present invention as defined by the following claims.

What is claimed is:

1. A method of fabricating dual damascene interconnections, the method comprising:
    (a) forming on a substrate an organo silicate glass layer having a dielectric constant of 3.3 or less;
    (b) forming a via in the organo silicate glass layer;
    (c) filling the via formed in the organo silicate glass layer with a carbon-free inorganic filler, the carbon-free inorganic filler extending laterally beyond top edges of the via;
    (d) processing the surface of the carbon-free inorganic filler filling the via formed in the organo silicate glass layer using plasma;
    (e) forming a photoresist pattern on the inorganic filler filling the via and extending laterally beyond the top edges of the via to define a trench;
    (f) after forming the photoresist pattern, partially etching the inorganic filler filling the via and extending laterally beyond the top edges of the via and the organo silicate glass layer to form the trench, which is connected to the via and in which interconnections will be formed;

(g) removing the inorganic filler remaining in the via; and
(h) completing interconnections by filling the trench and the via with interconnection material.

2. The method of claim 1, further comprising, before step (a),:
forming a lower interconnection on the substrate; and
forming an etch stop layer on the lower interconnection.

3. The method of claim 2, wherein the etch stop layer is formed of at least one of SiC, SiN, and SiCN.

4. The method of claim 1, wherein the organo silicate glass layer having a dielectric constant of 3.3 or less is formed using chemical vapor deposition.

5. The method of claim 1, further comprising, before step (b), forming a capping layer on the organo silicate glass layer having a dielectric constant of 3.3 or less, wherein in step (b), a via is formed in the capping layer and the organo silicate glass layer.

6. The method of claim 5, wherein the capping layer is formed of an anti-reflective material.

7. The method of claim 5, wherein the capping layer is formed of at least one of $SiO_2$, SiOF, SiON, SiC, SiN and SiCN.

8. The method of claim 2, wherein step (b) comprises:
forming a photoresist pattern on the organo silicate glass layer to define the via; and
forming the via exposing the etch stop layer by dry etching the organo silicate glass layer using the photoresist pattern as an etch mask.

9. The method of claim 1, wherein the carbon-free inorganic filler is an HSQ-based filler.

10. The method of claim 1, wherein the carbon-free inorganic filler further includes a light absorption material and/or a dissolution inhibitor for a photoresist developing solution.

11. The method of claim 1, further comprising, before step (e), forming an anti-reflection layer on the plasma-processed surface of the carbon-free inorganic filler.

12. The method of claim 1, wherein the plasma is derived from $O_2$, $H_2$, He, $NH_3$, $N_2$, Ar or any mixture thereof.

13. The method of claim 11, wherein the anti-reflection layer is an organic anti-reflection layer.

14. The method of claim 13, wherein the anti-reflection layer is formed to a thickness of about 500 Å to 700 Å.

15. The method of claim 1, wherein steps (e) and (f) include:
forming the photoresist pattern on the plasma-processed surface of the inorganic filler to define the trench;
forming the trench by dry etching using the photoresist pattern as an etch mask such that an etch ratio of the inorganic filler to the organo silicate glass layer is 4:1 or lower; and
removing the photoresist pattern.

16. The method of claim 15, wherein the dry etching uses $C_xF_y$ or $C_xH_yF_z$ as a main etching gas, and removing the photoresist pattern uses an $H_2$-based plasma.

17. The method of claim 1, wherein step (g) comprises wet etching such that an etch ratio of the inorganic filler to the organo silicate glass layer is 20:1 or higher.

18. The method of claim 17, wherein the wet etching uses diluted HF or a mixture of $NH_4F$, HF, and deionized water.

19. The method of claim 1, wherein in step (h), the interconnection is a copper interconnection.

20. A method of fabricating dual damascene interconnections, the method comprising:
(a) forming an organo silicate glass layer on a substrate;
(b) forming a via in the organo silicate glass layer;
(c) filling the via formed in the organo silicate glass layer with an HSQ-based filler, the HSQ-based filler extending laterally beyond top edges of the via;
(d) processing the surface of the HSQ-based filler filling the via formed in the oragano silicate glass layer using plasma;
(e) forming a photoresist pattern on the HSQ-based filler filling the via and extending
laterally beyond the top edges of the via to define a trench;
(f) after forming the photoresist pattern filling the via and extending laterally beyond the top edges of the via, partially etching the HSQ-based filler filling the via and extending laterally beyond the top edges of the via and the organo silicate glass layer to form the trench, which is connected to the via and in which interconnections will be formed;
(g) removing the HSQ-based filler remaining in the via; and
(h) completing interconnections by filling the trench and the via with an interconnection material.

21. The method of claim 20, wherein in step (a), the organo silicate glass layer is formed using chemical vapor deposition.

22. The method of claim 20, further comprising, before step (a),:
forming a lower interconnection on the substrate; and
forming an etch stop layer on the lower interconnection.

23. The method of claim 22, wherein the etch stop layer is formed of at least one of SiC, SiN, and SiCN.

24. The method of claim 20, further comprising, before step (b), forming a capping layer on the organo silicate glass layer.

25. The method of claim 24, wherein the capping layer is formed of an anti-reflective material.

26. The method of claim 24, wherein the capping layer is formed of at least one of $SiO_2$, SiOF, SiON, SiC, SiN, and SiCN.

27. The method of claim 22, wherein step (b) comprises:
forming a photoresist pattern on the organo silicate glass layer to define the via; and
forming the via exposing the etch stop layer by dry etching the organo silicate glass layer using the photoresist pattern as an etch mask.

28. The method of claim 20, wherein the HSQ-based filler further includes a light absorption material and/or a dissolution inhibitor for a photoresist developing solution.

29. The method of claim 20, further comprising, before step forming an anti-reflection layer on the plasma-processed surface of the HSQ-based filler.

30. The method of claim 20, wherein the plasma is $O_2$, $H_2$, He, $NH_3$, $N_2$, Ar, or any mixture thereof.

31. The method of claim 29, wherein the anti-reflection layer is an organic anti-reflection layer.

32. The method of claim 31, wherein the anti-reflection layer is formed to a thickness of about 500 Å to 700 Å.

33. The method of claim 20, wherein steps (e) and (f) include:
forming the photoresist pattern on the HSQ-based filler to define the trench;
forming the trench by dry etching using the photoresist pattern as an etch mask such that an etch ratio of the HSQ-based filler to the organo silicate glass layer is 4:1 or lower; and
removing the photoresist pattern.

34. The method of claim 33, wherein the dry etching uses $C_xF_y$ or $C_xH_yF_z$ as a main etching gas, and removing the photoresist pattern uses an $H_2$-based plasma.

35. The method of claim 20, wherein step (g) comprises wet etching such that an etch ratio of the HSQ-based filler to the organo silicate glass layer is 20:1 or higher.

36. The method of claim 35, wherein the wet etching uses diluted HF or a mixture of $NH_4F$, HF, and deionized water.

37. The method of claim 20, wherein in step (h), the. interconnection is a copper interconnection.

38. A method of fabricating dual damascene interconnections, the method comprising:
 (a) forming a lower interconnection on a substrate;
 (b) forming an etch stop layer on the lower interconnection;
 (c) forming an organo silicate glass layer using chemical vapor deposition on the etch stop layer;
 (d) forming a via through the organo silicate glass layer to expose the etch stop layer;
 (e) filling the via formed through the organo silicate glass layer with an HSQ-based filler filler, the HSQ-based filler extending laterally beyond top edges of the via;
 (f) processing the surface of the HSQ-based filler filling the via formed in the organo silicate glass layer using plasma;
 (g) forming an anti-reflection layer on the plasma-processed surface of the HSQ-based filler filling the via and extending laterally beyond the top edges of the via;
 (h) forming a photoresist pattern on the anti-reflection layer to define a trench;
 (i) after forming the photoresist pattern on the anti-reflection layer partially etching the anti-reflection layer, the HSQ-based filler filling the via and extending laterally beyond the top edges of the via, and the organo silicate glass layer to form the trench, which is connected to the via and in which interconnections will be formed;
 (j) removing the HSQ-based filler remaining in the via; and
 (k) completing interconnections by filling the trench and the vias with an interconnection material.

39. The method of claim 38, wherein the etch stop layer is formed of at least one of SiC, SiN, and SiCN.

40. The method of claim 38, before step (d), further comprising forming a capping layer on the organo silicate glass layer.

41. The method of claim 40, wherein the capping layer is formed of an anti-reflective material.

42. The method of claim 40, wherein the capping layer is formed of at least one of $SiO_2$, SiOF, SiON, SiC, SiN, and SiCN.

43. The method of claim 38, wherein the HSQ-based filler further includes a light absorption material and/or a dissolution inhibitor for a photoresist developing solution.

44. The method of claim 38, wherein the plasma is $O_2$, $H_2$, He, $NH_3$, $N_2$, Ar, or any mixture thereof.

45. The method of claim 38, wherein the anti-reflection layer is an organic anti-reflection layer.

46. The method of claim 45, wherein the anti-reflection layer is formed to a thickness of about 500 Å to 700 Å.

47. The method of claim 38, wherein step (h) includes:
 forming a photoresist pattern on the anti-reflection layer to define the trench;
 forming the trench by dry etching using the photoresist pattern as an etch mask such that an etch ratio of the HSQ-based filler to the organo silicate glass layer is 4:1 or lower; and
 removing the photoresist pattern.

48. The method of claim 47, wherein the dry etching uses $C_xF_y$ or $C_xH_yF_z$ as a main etching gas, and removing the photoresist pattern uses an $H_2$-based plasma.

49. The method of claim 38, wherein step (i) comprises wet etching such that an etch ratio of the HSQ-based filler to the organo silicate glass layer is 20:1 or higher.

50. The method of claim 49, wherein the wet etching uses diluted HF or a mixture of $NH_4F$, HF, and deionized water.

51. The method of claim 38, wherein in step (j), the interconnection is a copper interconnection.

* * * * *

UNITED STATES PATENT AND TRADEMARK OFFICE
CERTIFICATE OF CORRECTION

PATENT NO.         : 7,183,195 B2
APPLICATION NO. : 10/625007
DATED              : February 27, 2007
INVENTOR(S)        : Lee et al.

It is certified that error appears in the above-identified patent and that said Letters Patent is hereby corrected as shown below:

Column 11, line 21, delete "SIN" and insert --SiN--

Column 13, line 6, delete "." after the second occurrence of "the"

Signed and Sealed this

Third Day of July, 2007

JON W. DUDAS
*Director of the United States Patent and Trademark Office*